(12) United States Patent
von Zweck

(10) Patent No.: US 6,352,626 B1
(45) Date of Patent: Mar. 5, 2002

(54) SPUTTER ION SOURCE FOR BORON AND OTHER TARGETS

(76) Inventor: Heimart von Zweck, 17 Old Knoll Rd., Marion, MA (US) 02738

( * ) Notice: Subject to any disclaimer, the term of this patent is extended or adjusted under 35 U.S.C. 154(b) by 0 days.

(21) Appl. No.: 09/550,360

(22) Filed: Apr. 19, 2000

Related U.S. Application Data (60) Provisional application No. 60/130,024, filed on Apr. 19, 1999.

(51) Int. Cl.⁷ .......................... C23C 14/34; C23C 14/46
(52) U.S. Cl. .......................... 204/298.04; 204/298.09; 204/298.12; 204/298.14; 204/298.16
(58) Field of Search ........................ 204/298.04, 298.09, 204/298.12, 298.14, 298.16

(56) References Cited

U.S. PATENT DOCUMENTS

| | | | |
|---|---|---|---|
| 2,146,025 A | 2/1939 | Penning | 200/27.5 |
| 4,116,791 A | 9/1978 | Zega | 204/192 N |
| 4,166,018 A | 8/1979 | Chapin | 204/192 R |
| 4,282,083 A | 8/1981 | Kertesz et al. | 204/298 |
| 4,361,472 A | 11/1982 | Morrison, Jr. | 204/192 R |
| 4,376,025 A | 3/1983 | Zega | 204/192 R |
| 4,403,014 A | 9/1983 | Bergmann | 428/546 |
| 4,423,355 A | 12/1983 | Kageyama | 315/111.81 |
| 4,426,267 A | 1/1984 | Münz et al. | 204/192 R |
| 4,472,259 A | 9/1984 | Class et al. | 204/298 |
| 4,478,703 A | 10/1984 | Edamura et al. | 204/298 |
| 4,545,881 A | 10/1985 | Shinmi et al. | 204/192 SP |
| 4,581,118 A | 4/1986 | Class et al. | 204/298 |

(List continued on next page.)

FOREIGN PATENT DOCUMENTS

| | | | | |
|---|---|---|---|---|
| DE | 19622607 | * | 12/1997 | H01J/37/34 |

OTHER PUBLICATIONS

H. Baumann & K. Bethge, "Pig Ion Source with End Extraction for Multiply Charged Ions," Nuclear Instruments and Methods, vol. 122, pp. 517–525, 1974.

H. Baumann & K. Bethge, "The Frankfurt Pig Ion Source," Nuclear Instruments and Methods, vol. 189, pp. 107–110, 1981.

J.E. Hopson, "Beam–Generated Beam–Plasma System," Journal of Applied Physics, vol. 34, No. 8, pp. 2425–2429, Aug. 1963.

Primary Examiner—Nam Nguyen
Assistant Examiner—Steven H. VerSteeg
(74) Attorney, Agent, or Firm—Wolf, Greenfield & Sacks, P.C.

(57) ABSTRACT

The present invention relates to an improved ion source comprising a magnetron and cathode in a first housing and a cold cathode in a second housing. The second housing generally comprises a Penning cell to collimate an ion beam arising from the first housing. This arrangement provides an ion source capable of ejecting sputtered ions of the cold cathode magnetron discharge into a highly collimated, positive ion beam having low emittance angles. The invention also provides a cold cathode target for use in an ion source, and in particular, to an ion source having single or multiple targets of desired materials and/or dimensions to provide a rich source of boron ions in a manner allowing operation of the ion source free of producing significant toxic effects or corrosion. The invention also relates to a cold cathode target comprising a boron-containing material selected from the group consisting of a boron alloy, a boride, and mixtures thereof. The invention also relates to ion sources which comprise a single solid cathode disc or a multiple or array of solid cathode discs, or having a bore through on axis, in which the cathode is made of conductive materials such as metals, alloys and metal compounds. Example materials include indium, aluminum and indium phosphide. The ion source can be a source of positive gas ions.

70 Claims, 6 Drawing Sheets

U.S. PATENT DOCUMENTS

| | | | |
|---|---|---|---|
| 4,629,548 A | 12/1986 | Helmer .................. | 204/298 |
| 4,731,116 A | 3/1988 | Kny ....................... | 75/238 |
| 4,774,437 A | 9/1988 | Helmer et al. .......... | 315/111.81 |
| 4,783,595 A | 11/1988 | Seidl ..................... | 250/423 R |
| 4,810,347 A | 3/1989 | Smith ..................... | 204/298 |
| 4,820,392 A | 4/1989 | Moskowitz et al. ..... | 204/192.11 |
| 4,824,544 A | 4/1989 | Mikalesen et al. ...... | 204/298 |
| 5,047,131 A | 9/1991 | Wolfe et al. ........... | 204/192.23 |
| 5,089,746 A | 2/1992 | Rosenblum et al. .... | 315/111.81 |
| 5,234,560 A | 8/1993 | Kadlec et al. ......... | 204/192.12 |
| 5,277,778 A | 1/1994 | Daube et al. .......... | 204/298.19 |
| 5,330,628 A | 7/1994 | Demaray et al. ....... | 204/192.12 |
| 5,346,601 A | 9/1994 | Barada et al. .......... | 204/192.15 |
| 5,392,981 A | 2/1995 | Makowiecki et al. .... | 228/122.1 |
| 5,514,485 A | 5/1996 | Ando et al. ............. | 428/702 |
| 5,584,973 A | 12/1996 | Wada et al. ............ | 204/192.12 |
| 5,593,551 A | 1/1997 | Lai ........................ | 204/192.12 |
| 5,624,536 A | 4/1997 | Wada et al. ............ | 204/298.11 |
| 5,635,036 A | 6/1997 | Demaray et al. ....... | 204/192.12 |
| 5,670,252 A | 9/1997 | Makowiecki al. ....... | 428/336 |
| 5,702,573 A | 12/1997 | Biberger et al. ........ | 204/192.12 |
| 5,723,188 A | 3/1998 | Lüthje et al. ........... | 427/577 |
| 5,728,276 A | 3/1998 | Katsuki et al. ......... | 204/298.11 |
| 5,766,747 A | 6/1998 | Makowiecki et al. .... | 428/220 |
| 5,861,630 A | 1/1999 | Becker ................... | 250/423 R |
| 6,022,461 A | 2/2000 | Kobayashi et al. ..... | 204/298.07 |
| 6,030,511 A | 2/2000 | Shinmura ............... | 204/192.15 |
| 6,036,821 A | 3/2000 | Warren ................... | 204/192.12 |
| 6,045,672 A | 4/2000 | Kobayashi et al. ..... | 204/298.2 |

\* cited by examiner

SPUTTER ION SOURCE FOR BORON AND OTHER TARGETS

This non-provisional application claims the benefit under Title 35 U.S.C. §119(e) of co-pending U.S. provisional application serial No. 60/130,024 filed Apr. 19, 1999, entitled "Boron-Containing Ion Source Having an Extended Life", by Heimart von Zweck, incorporated herein by reference.

FIELD OF THE INVENTION

The invention relates generally to an improved ion source comprising a magnetron in conjunction with a Penning cell, for producing highly collimated ion beams. The ion beams result from ionizing gases such as helium, argon, nitrogen, carbon oxide(s) and fluorides and sputtering a wide variety of target materials, including metals, alloys, borides, and nitrides. The invention also relates to producing ion beams rich in boron ions by sputtering a boron-containing target in an ion source in which the target has thick dimensions that provide the ion source with an extended life. The resulting boron ion beam can be useful for applications such as thin film deposition and ion implantation.

BACKGROUND OF THE INVENTION

There is a continuing need to provide ion sources which produce ion beams that are highly directional and/or collimated. The ion beams can be used in a variety of applications such as in the manufacture of semiconductors, thin film deposition and surface modification via ion implantation.

Boron is an important constituent in thin film depositions on optical and electronic recording surfaces and as a dopant in the manufacture of semiconductor circuits and components. Boron is usually processed as boron ions formed by dissociating a boron target in the plasma of an ion source. Typically the ions are extracted from the ion source employing boron trifluoride as a source of ions. The boron ions are usually separated in a mass analyzer, and transported through an ion accelerator, employing apparatus well-known to the industry.

Boron trifluoride, however, is a hazardous material classified as a poison and as a non-flammable gas. It is toxic when inhaled and severely corrosive to the skin, eyes and mucous membranes, causing serious burns on contact. In certain instances, a ceiling limit of 1 ppm (parts per million) gaseous boron trifluoride may be imposed for handling this gas in air. In addition, the handling of boron trifluoride requires training and special safety precautions, special clothing and safety apparatus. Personnel are required to change or replace components of the ion source or gas cylinders and their supply lines to the equipment, causing them to handle parts previously exposed to poisonous boron trifluoride gas.

In addition, dissociated fragments of boron trifluoride can be severely corrosive to the ion source, beam line components, and associated equipment such as vacuum pumps and vacuum valves can be severely affected by the corrosion, thus reducing the operational time. Users of equipment employing boron trifluoride as a source of boron might expect to replace or rebuild the filament after 24 beam hours in high flux boron ion sources. A long tool life between maintenance and high stability are vital characteristics for the operation of such ion sources on a production line.

The potential toxic and corrosive aspects arising from using boron trifluoride are major obstacles to improving the life span of a traditional boron ion sources and its associated equipment. Thus, there is a need for an ion source capable of producing boron ion beams while maintaining an improved tool life for extended periods of time.

SUMMARY OF THE INVENTION

One aspect of the present invention provides an ion source. In one embodiment, the ion source comprises a magnetron disposed in a first housing being constructed and arranged to produce a radial magnetic field coaxial with an axial electric field. A positively charged, sputtered ion beam is provided from the magnetron. A cold cathode sputtering target is disposed in a second housing in which the second housing is constructed and arranged to produce a radial electric field and an axial magnetic field for collimating the ion beam from the magnetron. The radial electric field and axial magnetic field are coaxial with each other and with a direction of the sputtered ion beam which is normal to a planar surface of the cold cathode.

Another embodiment of the ion source of the invention comprises a magnetron for generating a magnetic field and a cathode having a planar face positioned adjacent the magnet ion. The cathode comprises a cold cathode sputtering target and comprises a material by which a positive ion beam is formed. The ion source further comprises a collimator comprising trapped electrons for collimating the ion beam, the trapped electrons and the ion beam being coaxial with each other.

Another embodiment of the ion source of the invention comprises a magnetron having an axis, constructed and arranged to produce a magnetic field radial with respect to the magnetron axis, and coaxial with an axial electrical field with respect to the magnetron axis, for providing a positively charged, sputtered ion beam from the magnetron. The ion source further comprises a Penning cell including a cold cathode sputtering target and having an axis, the Penning cell being constructed and arranged to produce an electric field radial with respect to the Penning cell axis and a magnetic field axial with respect to the Penning cell axis and being positioned to collimate the ion beam from the magnetron. The Penning cell has a radial electric field and axial magnetic field coaxial with each other. A direction of the sputtered ion beam is normal to a planar surface of the cold cathode.

Another embodiment of the ion source of the invention comprises a magnetron for generating a magnetic field and a cathode comprising a cold cathode sputtering target and comprising a material by which a positive ion beam can be formed. The cathode is positioned relative to the magnetron so as to be able to form a positive ion beam involving crossed magnetic and electric fields generated by the magnetron. The ion source further comprises a collimator able to trap electrons for collimating the ion beam, the collimator being positionable such that the trapped electrons and the ion beam are coaxial with each other.

Another aspect of the present invention provides a cold cathode comprising a boron-containing, sputtering target material with a bore through on axis, for use in an ion source. The material is selected from the group consisting of a boron alloy, a boride, and mixtures thereof.

Another embodiment of the ion source of the invention comprises a single solid disc electrode. The solid disc electrode comprises a boron-containing material selected from the group consisting of a boron alloy, a boride, and mixtures thereof.

Another embodiment of the ion source of the invention comprises an array of at least two disc electrodes. Each electrode comprises a boron-containing material selected from the group consisting of a boron alloy, a boride, and mixtures thereof.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION

The present invention relates to an ion source sputtering apparatus having a magnetron in conjunction with a Penning cell. This arrangement of components provides an ejected beam of sputtered, positive ions of cathode material in a highly collimated fashion in which the yield and emittance angles of the ejected beam are greatly improved over ion sources of the prior art. The present invention also relates to the use of a cold cathode comprising a boron-containing material. Thick dimensions of the cathode coupled with a low toxicity of the boron-containing material allows this ion source to be used continuously for increased periods of time. The resulting product from the sputtering apparatus can be useful for applications in ion implantation for the manufacture of semiconductors, for thin film deposition in forming surface layers, and for surface modification by ions implanted in the surfaces of various articles and films.

Figure 1:
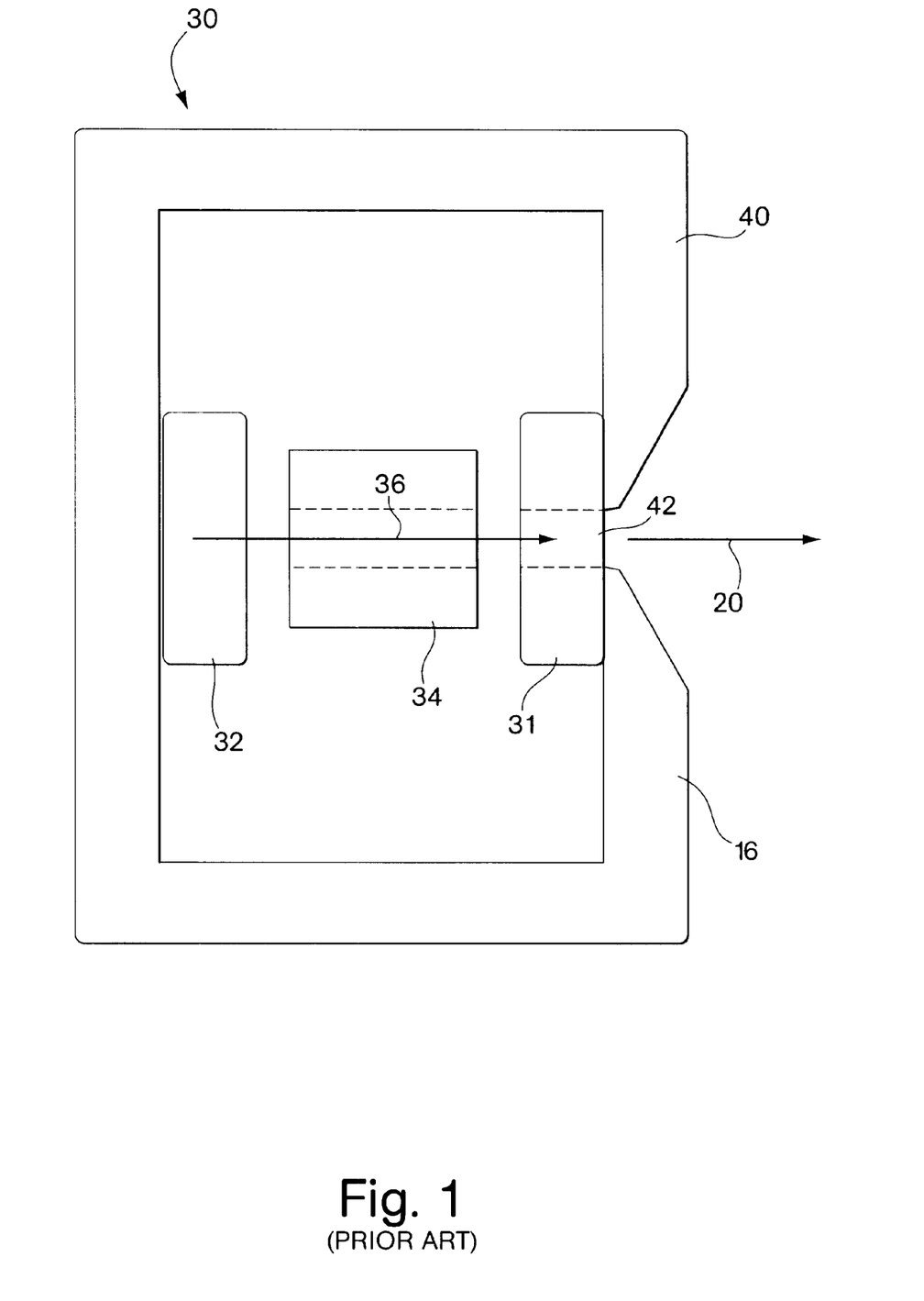
FIG. 1 shows a cross-sectional, schematic representation of a side view of a prior art ion source.

FIG. 1 shows a cross-sectional schematic representation of a side view of a prior art ion source. In FIG. 1, ion source 30 includes a cathode 31 disposed within one end of housing 40. Cathode 31 is a disc having two opposing planar faces, i.e. an inner and outer face in which the outer face is positioned facing the end of housing 40. Cathode 31 includes a bore 42 positioned in the center of cathode 31. Anode 34 has a hollow cylindrical structure, and a base of the cylinder is disposed adjacent the inner face of cathode 31 such that respective axes of anode 34 and bore 42 are coaxial. Anode 34 and cathode 31 are also free of contact with each other. Anticathode 32 is a solid disc having two opposing planar faces. Anticathode 32, anode 34, cathode 31 and bore 42 are centered on axis. Cathode 31, anode 34 and anticathode 32 are connected to a d.c. supply (not shown).

Ion source 30 also includes an annular magnet (not shown) surrounding anode 34.

During operation of ion source 30, housing 40 is placed under a vacuum and d.c. electric power is supplied to the electrodes to provide an electric field having directional lines coaxial with the axes of the electrodes. Anode 34 is biased at a positive potential with respect to cathode 31 and anticathode 32. The annular magnet provides a magnetic field (as indicated by arrow 36) which collimates electrons emitted in a d.c. discharge contained in a crossed field provided by anode 34 and the magnet. An inert gas, supplied to the channel within by anode 34, is ionized and sustains the discharge. Cathode 31, being negatively biased, repels electrons but attracts the positive gas causing positive ions (as indicated by arrow 20) of the anticathode material to be ejected from ion source 30 through bore 42 of cathode 31.

The prior art ion source thus described, and other similar ion sources, provides a beam of positive ions which is generally poorly collimated. When, for example, the prior art ion source is coupled to an ion optics of a beam line, a poorly collimated beam will result in an inefficient acceptance of the ion beam and poor transport by the beam line equipment.

One aspect of the present invention provides an improved ion source for generating a highly collimated beam of positive ions ensuing from a cold cathode target material. In this aspect, an ion source comprising a magnetron is disposed in a first housing constructed and arranged to produce a radial magnetic field coaxial with an axial electric field. The ion source further comprises a cold cathode sputtering target disposed in a second housing. "Ion source", as used herein, refers to any apparatus capable of producing a discharge of ions. One example of producing a discharge of ions involves sputtering. "Sputtering", as used herein, refers to a process of disintegrating a target material under the impact of energetic ions, causing the target surface to be dissociated into free atoms, ions or molecular fragments of the target material. "Magnetron", as used herein, refers to any device capable of ionizing a target material by sputtering.

"Cold cathode", as used herein, refers to a cathode free of a thermionic emission. In one embodiment, the cold cathode is operable at a temperature of less than about 950° C., more preferably less than about 500° C., and more preferably less than about 200° C.

Figure 2:
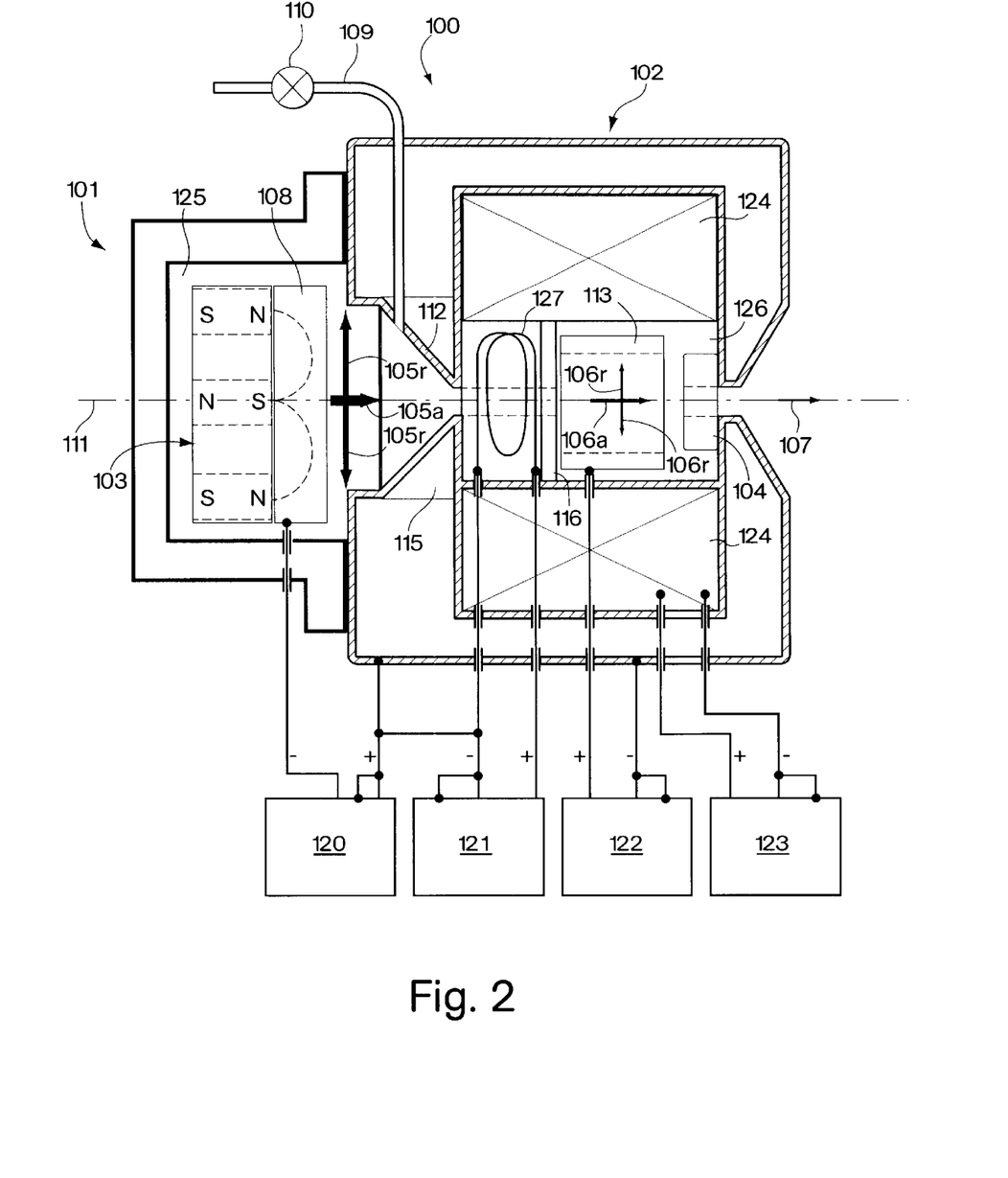
FIG. 2 shows a cross-sectional, schematic representation of a side view of an ion source of the present invention.

FIG. 2 shows a cross-sectional, schematic side view of one embodiment of an ion source of the present invention. In FIG. 2, ions source 100 comprises a first housing 101 and a second housing 102. First housing 101 contains a magnetron 103 which provides an axial electric field having a direction as indicated by arrow 105a, and a radial magnetic field having a direction as indicated by arrow 105r. Radial magnetic field 105r and axial electric field 105a are coaxial with each other. Housing 102 comprises a cold cathode 104 disposed at an end of housing 102, particularly the end opposite housing 101. Housing 102, by way of components contained therein is constructed and arranged to produce a radial electric field (shown as arrow 106r) coaxial with an axial magnetic field (shown as arrow 106a). In one embodiment, second housing 102 comprises a Penning cell, i.e. any cell capable of providing crossed magnetic field and electric fields. Respective directions of the fields are substantially normal to each other but can differ from normality. Cathode 104 has a planar face which helps to ensure predictable directionality of ions emitted from cathode 104. In one embodiment, cathode 104 has two opposing planar faces. Cathode 104 is shown in FIG. 2 as a disc, although cathode 104 can comprise a variety of shapes that provide a planar face, and preferably two opposing planar faces.

Magnetron 103 is capable of producing a sputtered ion beam of positively charged ions. The beam is received by second housing 102, in which the beam is coaxial with fields 106r and 106a and normal to a planar face of cathode 104, and preferably to both opposing planar faces of cathode 104. Second housing 102 serves to collimate the beam from magnetron 103. Magnetron 103 can comprise a single magnetron, or two or more magnetrons. FIG. 2 illustrates fields 105a and 105r as being coaxial with fields 106a and 106r along axis 111, although this arrangement is not necessary as long as the net result produces an ion beam coaxial with fields 106a and 106b of second housing 102. Thus the beam initially generated by the magnetron may not have the coaxial arrangement, but when the beam is eventually received by the Penning cell, it is coaxial with crossed fields 106a and 106r of second housing 102. By this arrangement, the ion beam drawn into the second housing 102 from first housing 101 can be collimated by magnetic field 106a and electric field 106b as they diffuse through on an imaginary axis 111. As a result, an ion beam (having a direction shown as arrow 107) is ejected from ion source 100 that is more collimated and having lower emittance angles than ion beams provided by many prior art ion sources. In one embodiment, at a vacuum greater than $10^{-4}$ mm Hg, the beam comprising positive ions has an emittance angle of less than 150 milliradians, and preferably at a vacuum greater than $1\times10^{-3}$ mm Hg, the beam comprising positive ions has an emittance angle of less than 150 milliradians.

In one embodiment, the first housing also includes anticathode 108 having a surface, which can be planar, positioned adjacent magnetron 103. Anticathode 108 comprises a target sputtering material. In one embodiment, anticathode 108 comprises a cold cathode. Thus, magnetron 103, having crossed fields 105a and 105b, in conjunction with anticathode 108 is capable of producing a positive ion beam comprising sputtered anticathode material. In one embodiment, anticathode 108 has a variable bias potential. In one embodiment, anticathode 108 is biased negative. Anticathode 108 is connected to a magnetron d.c. supply 120. In one embodiment, anticathode 108 has two planar opposing faces, and like cathode 104, can be shaped as a disc. It is not necessary that anticathode 108 and cathode 104 have the same shape or even comprise the same material.

In one embodiment, the ion source further comprises a source of a gas directed towards the anticathode, for producing a gas discharge. The gas discharge can comprise positive ions of the inert gas. In one embodiment, the ion source ejects a beam of positive gas ions, and thus comprises a source of positive gas ions. In another embodiment, the gas discharge comprises positive ions of cathode and anticathode material. Ionized gas used to bombard the target can be an ion discharge of an inert gas e.g. a noble gas such as helium, neon, argon or a gas such as nitrogen. In one embodiment, the gas is a reactive gas such as nitrogen, carbon monoxide, carbon dioxide or various fluorides. This sputtering process is known as reactive sputtering in which the ionized gas combine with cathode material to produce a variety of compounds. FIG. 2 shows conduit 109 for the gas. A rate of gas flow can be controlled by valve 110.

In one embodiment, the ion source further comprises an annular anode positioned in the second housing. Referring to FIG. 2, anode 113 has a cylindrical shape, a base of which is positioned adjacent to and free of contact with cathode 104. Anode 113 surrounds axial magnetic field 106a. It is understood that anode 113 does not have to be strictly cylindrical and can be tapered. Anode 113 is shown connected to a discharge d.c. supply 122. Cathode 104 (biased negative) in conjunction with anode 113 (biased positive with respect to cathode 104) is capable of generating electric field 106b which traps electrons of the discharge in axis 111 of magnetic field 105b.

It is a feature of the present invention that the trapped electrons in housing 102 serve to collimate the gas comprising positive ions and sputter discharge from housing 101. The fields 106a and 106b in second housing 102 provide this high level of collimation. In one embodiment, ion source 100 further comprises an annular magnet 124 surrounding both cathode 104 and anode 113. Magnet 124 is connected to a solenoid d.c. supply 123. Magnetic field 106a causes the trapped electrons to have a spiraling trajectory. This trajectory increases the probability of ionizing collisions to produce a Penning discharge (i.e., a discharge produced in second housing 102) to produce ions in single and higher charge states.

In one embodiment, the ion source further comprises a duct positioned intermediate the first and second housings. Referring to FIG. 2, duct 112 is tapered in a direction from magnetron 103 to cathode 104. FIG. 2 shows duct tapered as a funnel, although any gradient of tapering is possible, as desired. Tapered duct 112 can channel the sputtered discharge from first housing 101 and block any unwanted sputter debris from entering second housing 102. In one embodiment, duct 112 is operable at ambient temperature. In another embodiment, the ion source further comprises a cooling mechanism (not shown in FIG. 2) associated with the duct, preferably surrounding the duct, for condensing volatile material and preventing entry of volatile material into the second housing. It is understood that duct 112 is not always necessary, depending on the specific arrangements of components in housing 101.

Duct 112 can terminate in the second housing at an aperture in a plate. Referring to FIG. 2, in this embodiment, ion source 100 further comprises plate 116 having two opposing faces, in which one face is disposed adjacent to and free of contact with a cylindrical base of anode 113 which is opposite the base adjacent to cathode 104. FIG. 2 shows duct 112 extending as a channel and terminating at aperture 115. Of course, other tapered arrangements can be envisioned, as duct 112 can comprise a continuous taper to aperture 115. In one embodiment, plate 116 is conductive and can comprise a conductive material such as graphite or a metal. Plate 116 can be biased at a negative potential and can aid in the provision of electric field 106. FIG. 2 shows plate 116 connected to d.c. supply 121.

During operation of ion source 100, each of housings 101 and 102 comprise a vacuum chamber, and a vacuum permeates areas 125 and 126 of first and second housings 101 and 102 respectively. It is a feature of the invention that housings 101 and 102 can be independently placed under differing vacuum pressures. In one embodiment, ion source 100 is operated under conditions in which second housing 102 has a greater vacuum than that of first housing 101. For example second housing 102 can have a vacuum greater than $10^{-4}$ mm Hg, and preferably a vacuum greater than $10^{-3}$ mm Hg.

In one embodiment, the cathode has a bore for allowing the positive ion beam to collide with a surface of the cathode and eject from the ion source through the bore. Thus, the ejected ion beam can comprise positive ions sputtered from the cathode. In one embodiment, the bore is round and the ejected ion beam has cylindrical geometry. In another embodiment, the bore is a slit and the ejected ion beam has planar geometry. Of course, other shapes of the bore can be envisioned, depending on the application of the ion source and/or the article to be coated.

The cathode and/or anticathode can comprise a material selected to provide a desired ion type. In one embodiment, the cathode and/or anticathode comprise a conducting material having a resistivity of less than about 1000 $\mu$ohm·cm. The conducting material can comprise a carbon material, a metal, a metal compound, or the like. Examples of suitable carbon materials include graphite. Examples of suitable metals include aluminum, indium, antimony, copper, gold and uranium. Examples of suitable metal alloys include cobalt alloys. Examples of suitable metal compounds include ceramics such as metal borides, metal nitrides and metal phosphides such as indium phosphide. In another embodiment, the cathode comprises a material that is different from the anticathode material. In one embodiment, the cathode comprises the same material as the anticathode. In one embodiment, the ion source comprises a cathode and anticathode that is free from exposure to a cooling system, where the exposure can be direct or indirect.

In one embodiment, the ion source further comprises a filament positioned in the duct and arranged to surround the gas discharge. The filament can be used for the purpose of adding electrons to the trapped electrons while affecting the vacuum within the system only minimally. Referring to FIG. 2, filament 127 is contained within duct 112. Filament 127 comprises a wire, preferably of a conducting material, that is wound in a helical fashion around an ensuing gas discharge. Filament 127 is shown in FIG. 2 as being connected to filament d.c. supply 121. Depending on the amount of electrons produced by the ion source, filament 127 does not necessarily need to be included. In the arrangement where a duct is not used, filament can be positioned between first and second housings 101 and 102, respectively.

The ion source can further comprise a mass spectrometer associated with the magnetron for mass-separating the ejected ion beam. In one embodiment, the mass spectrometer is positioned adjacent, although not necessarily contacting, the cathode having a bore through on axis.

Another aspect of the present invention provides an ion source comprising a magnetron for generating a magnetic field and a cathode positioned adjacent the magnetron. In one embodiment, the "cathode" refers to the anticathode 108 of ion source 100, as shown in FIG. 2. The cathode comprises a cold cathode sputtering target and comprises a material by which a positive ion beam is formed.

In this aspect, the ion source comprises a collimator comprising trapped electrons for collimating the ion beam. In one embodiment, the collimator is a Penning cell, in which crossed electric and magnetic fields provide the collimation. The collimator is arranged with respect to the magnetron and the cathode (i.e. anticathode) such that the trapped electrons and the ion beam entering the collimator, are co-axially arranged. In one embodiment, the magnetron and collimator are in a single housing. In another embodiment, the magnetron and collimator are situated in separate housings.

Another aspect of the present invention provides an ion source, comprising a magnetron having an axis. The ion source is constructed and arranged to produce a magnetic field radial with respect to the magnetron axis, and coaxial with an axial electrical field with respect to the magnetron axis, for providing a positively charged, sputtered ion beam from the magnetron. The ion source further comprises a Penning cell including a cold cathode sputtering target and having an axis. The Penning cell is constructed and arranged to produce an electric field radial with respect to the Penning cell axis and a magnetic field axial with respect to the Penning cell axis and being positioned to collimate the ion beam from the magnetron. The Penning cell has a radial electric field and axial magnetic field coaxial with each other. A direction of the sputtered ion beam is normal to a planar surface of the cold cathode. The magnetron and Penning cell can be situated in a single housing or in separate housings. In one embodiment, the ion source further comprises an anticathode positioned adjacent but not necessarily contacting the magnetron, so long as the desired electric and magnetic fields are produced.

Another aspect of the present invention provides an ion source, comprising a magnetron for generating a magnetic field and a cathode comprising a cold cathode sputtering target, and comprising a material by which a positive ion beam can be formed. The anticathode can have planar opposing faces or can be of any shape that produces the desired fields. The cathode is positioned relative to the magnetron so as to be able to form a positive ion beam involving crossed magnetic and electric fields generated by the magnetron. The ion source further comprises a collimator able to trap electrons for collimating the ion beam, the collimator being positionable such that the trapped electrons and the ion beam are coaxial with each other.

Figure 7:
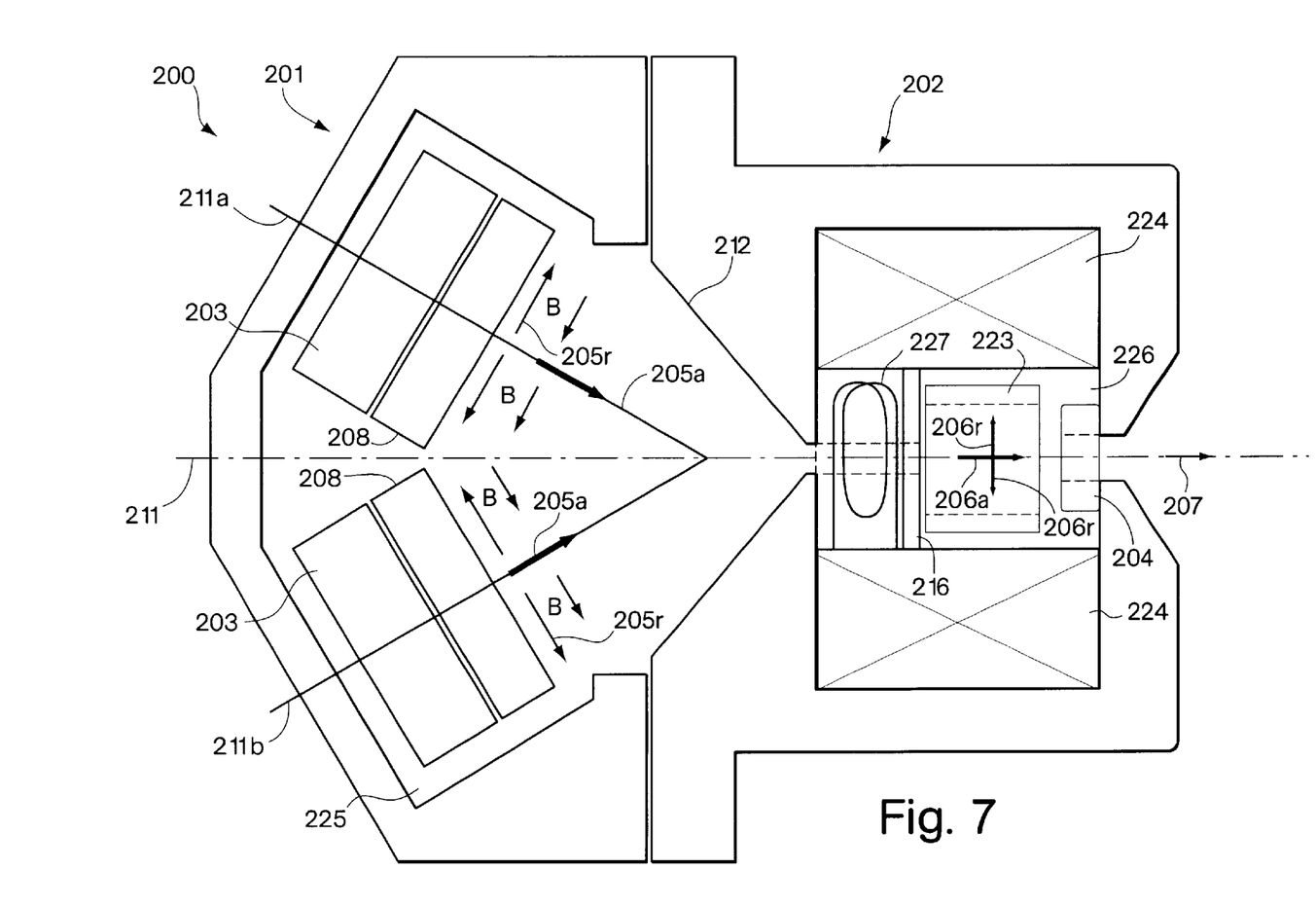
FIG. 7 shows a cross-sectional, schematic representation of a side view of an ion source of the present invention having two magnetrons.

FIG. 7 shows another example of an ion source of the present invention, comprising two magnetrons. The labeled components of FIG. 7 are consistent with those of FIG. 2, except all components are of the "200" series. FIG. 7 shows ion source 200 comprising first housing 201 and second housing 202, although ion source 200 can be situated within a single housing. A vacuum permeates areas 225 and 226 of the first and second housings 201 and 202, respectively. Second housing contains annular anode 223 positioned adjacent cathode 204, in which cathode 204 has a bore. Ion source 200 comprises two magnetrons 203 positioned adjacent respective anticathodes 208. Magnetrons 203 produce axial electric fields 205a (positioned along imaginary axes 211a and 211b) coaxial with radial magnetic fields 205r. A resulting ion beam from magnetrons 203 is arranged to enter second housing 202 in which the beam is coaxial with radial electric field 206r and axial magnetic field 206a (generated by annular magnet 224) along imaginary common axis 211. The beam from magnetrons 203 can be deflected to axis 211 by various means known in the art, or the beam can be channeled by duct 212, or a combination of these mechanisms. As a result, an ion beam (having a direction shown as arrow 207) is ejected from ion source 200 that is more collimated and having lower emittance angles than ion beams provided by many prior art ion sources. In one embodiment, ion source 200 further comprises plate 216 having two opposing faces, similar to plate 116 of FIG. 2. Optionally, ion source 202 can further comprise filament 227. Of course, more than two magnetrons can be used to generate an ion beam, depending on the application.

Another aspect of the present invention provides a cold cathode comprising a boron-containing, sputtering target material having a structure with a bore through on axis. The cold cathode is used in an ion source apparatus. In one embodiment, the source can include an anode and a cathode placed within a magnetic field for producing an ion discharge. Applying an anode potential of at least 300 V under a vacuum of about 10 mtorr to about 100 mtorr initiates a discharge causing a gas to ionize. The ion source used can be any ion source known in the art, including any ion source described.

In one embodiment, the boron-containing material is selected from the group consisting of a boron alloy, a boride, and mixtures thereof. Where the boron-containing material is a boride, the boride can be a metal boride. The resulting dissociated cathode material can comprise neutral boron atoms or positive boron ions predominantly in the +1 state. The dissociated material can include small amounts of boron ions in the +2 or +3 state. The metal boride can be stoichiometric or non-stoichiometric. A non-stoichiometric target may contain boron and other metal atoms. A mixture containing the boron alloy and boride can also be stoichiometric or non-stoichiometric and can include a metal boride and a metal-boron alloy. An example of a non-stoichiometric mixture involves aluminum ions and boride ions as well as excess aluminum atoms.

In one embodiment, the boron-containing material comprises a structure with a bore through on axis for passing a discharge of ions therethrough. In a preferred embodiment, the cylindrical structure resembles a disc with a bore through on axis. In one embodiment, the boron-containing material has a cylindrical structure of substantial bulk. This allows the application of a robust construction of the target cathode with faces for mounting with heat transfer by contact with the ion source housing. In one embodiment, the disc has an outer diameter, and the bore has an inner diameter, wherein a difference between the outer and inner diameter defines a wall thickness. In one embodiment, the outer diameter is at least twice the inner diameter. These dimensions ensure a robust construction of the cathode such that the ion source can operate continuously for extended periods of time. The dimensions of the cathode according to this embodiment of the present invention are distinguished from the arrangement of U.S. Pat. Nos. 4,774,437 and 5,089,746 where the prior art cathode is cylindrical and has very thin walls compared to its bore diameter. One aspect of the invention involves the recognition of a problem that thin walls are undesirable in a cathode material. Such thin cathode materials can experience severe erosion in relatively short periods of operational time (beam time). In addition, these thin dimensions can suffer disadvantages in cooling the cathode material during operation. In an area where ion discharge occurs, the cathode experiences elevated temperatures. A thin-walled material that is heated, from only one side, can elongate and/or distort, causing the thin wall to move away and lose contact with surfaces provided for cooling. The cathode can become progressively hotter as it benefits less from the cooling mechanism, possibly resulting in further distortion. Thus, localized temperature-enhanced sputter effects can occur, where certain sites of the cathode experience severe erosion in a very short time.

In contrast, the present invention can provide such desired cathode dimensions to prevent facile erosion of the cathode and especially provide a distributed sputtering effect to provide for a more even wear of the cathode for extended cathode lifetimes. This boron-containing cathode of the present invention can be used in connection with any arrangements described herein, as well as prior art arrangement including one described in Baumann and Bethge (Nuclear Instruments and Methods, vol. 122, pp. 517–525, 1974; and in Nuclear Instruments and Methods, vol. 189, pp. 107–110, 1981) which are both hereby incorporated by reference in their entirety.

An advantageous feature of the present invention resides in a simple geometry of the cold cathode target in use with the preferred design of the ion source. By designing the targets as discs, the targets can be readily fabricated by cutting from standard stock, commercially available as a round bar or as a sheet. In addition a preferred design of the ion source housing is cylindrical, and the cylindrical geometry of the target can be configured for substantial contact with the source housing to provide optimal heat transfer. In the form of discs, the target can also be configured to fit as pole tips mounted coaxial with a magnetic circuit of the ion source. A resulting substantial wall thickness also allows sputtering to occur over an extended period of time, i.e., a substantial number of beam hours. In one embodiment, the ion source containing the boride of the present invention can operate continuously for at least about 50 h (i.e. 50 beam hours), preferably at least about 100 h, and more preferably at least about 200 h.

Another advantageous feature of the present invention lies in the design features of the cathode target such that the lifetime of the ion source is extended. Prior art boron-containing ion sources that use corrosive substances such as $BF_3$ can suffer decreased lifetimes due to extensive corrosion of the components of the ion source. Thus, in one embodiment, the target of the present invention is constructed and arranged such that the ion source is operable while free of significant corrosion allowing continuous operation for at least about 100 h. The elimination of corrosive aspects of the ion source also provides safety benefits. The corrosive substances can also impart toxicity to the source components and present a dangerous environment to workers maintaining the ion source. Thus, in another embodiment, the target is constructed and arranged such that the ion source is operable while free of imparting significant toxicity, i.e., much less toxic than using $BF_3$.

In one embodiment, the boron-containing target has a low resistivity. Preferably, the target has a resistivity of less than about 1000 $\mu$ohm·cm, more preferably less than about 100 $\mu$ohm·cm, more preferably less than about 50 $\mu$ohm·cm, more preferably less than about 20 $\mu$ohm·cm, and even more preferably less than about 10 $\mu$ohm·cm. Examples of a boron-containing material having resistivities less than about 50 $\mu$ohm·cm include a boride such as $FeB_2$, $ZrB_2$, $DyB_2$, $GdB_2$, $MoB_2$, $TaB_2$, $TiB_2$, $YB_2$, $CrB_2$, $ErB_2$, $HfB_2$, $HoB_2$, $MnB_2$, and $VB_2$.

In one embodiment, the boron-containing material is a boride having an $AlB_2$ structure. Examples of $AlB_2$ structures include $AgB_2$, $AlB_2$, $AuB_2$, $FeB_2$, $LuB_2$, $NbB_2$, $PuB_2$, $SmB_2$, $TbB_2$, $TmB_2$, $WB_2$, $ZrB_2$, $DyB_2$, $MgB_2$, $GdB_2$, $MoB_2$, $ScB_2$, $TaB_2$, $TiB_2$, $UB_2$, $YB_2$, $CrB_2$, $ErB_2$, $HfB_2$, $HoB_2$, $MnB_2$, $NpB_2$ and $VB_2$.

In a preferred embodiment, the boride is $TiB_2$, which can be purchased from Goodfellow Corp., Berwyn, Pa., 19312. $TiB_2$ is a solid with physical properties of a refractory material (melting point=2700–2900° C.) but having an electrical resistivity of about 9 $\mu$ohm·cm. This solid is inert under standard conditions and can be handled safely without taking special precautions.

An advantageous feature of the ion source incorporating the target of the present invention is that the target functioning as an electrode can have dimensions allowing maintenance of a magnetic field of about 1 to 2.5 kilogauss.

In one embodiment, the target comprises a magnetic material which facilitates maintenance of a desired magnetic field strength. The magnetic material can be a magnetic boride.

In one embodiment, the target comprises a boron-containing material and a magnetic material i.e. an additional magnetic material can be added to bestow magnetic properties to the target or to enhance existing properties. The magnetic material can be a non-boron-containing material such as a metal. Examples of such metals include iron and nickel. In a preferred embodiment, the metal is iron. The boron-containing material can be any discussed above, including a boride, a sintered boride or any other processed boride.

Another advantageous feature of the target of the present invention is a resulting high yield of the boron ions produced. For example, when $BF_3$ is used as a source material, the maximum yield of boron ions is 25% due to the discharge of three fluorine atoms. In addition, extra energy is required to cause dissociation of three B—F bonds. Boron-containing materials, and in particular metal diborides can result in a higher atomic percent of boron up to 66% with less expenditure of energy for bond dissociation than for $BF_3$, as the result of a decreased number of boron-containing bonds in the boron-containing materials of the present invention.

Figure 3:
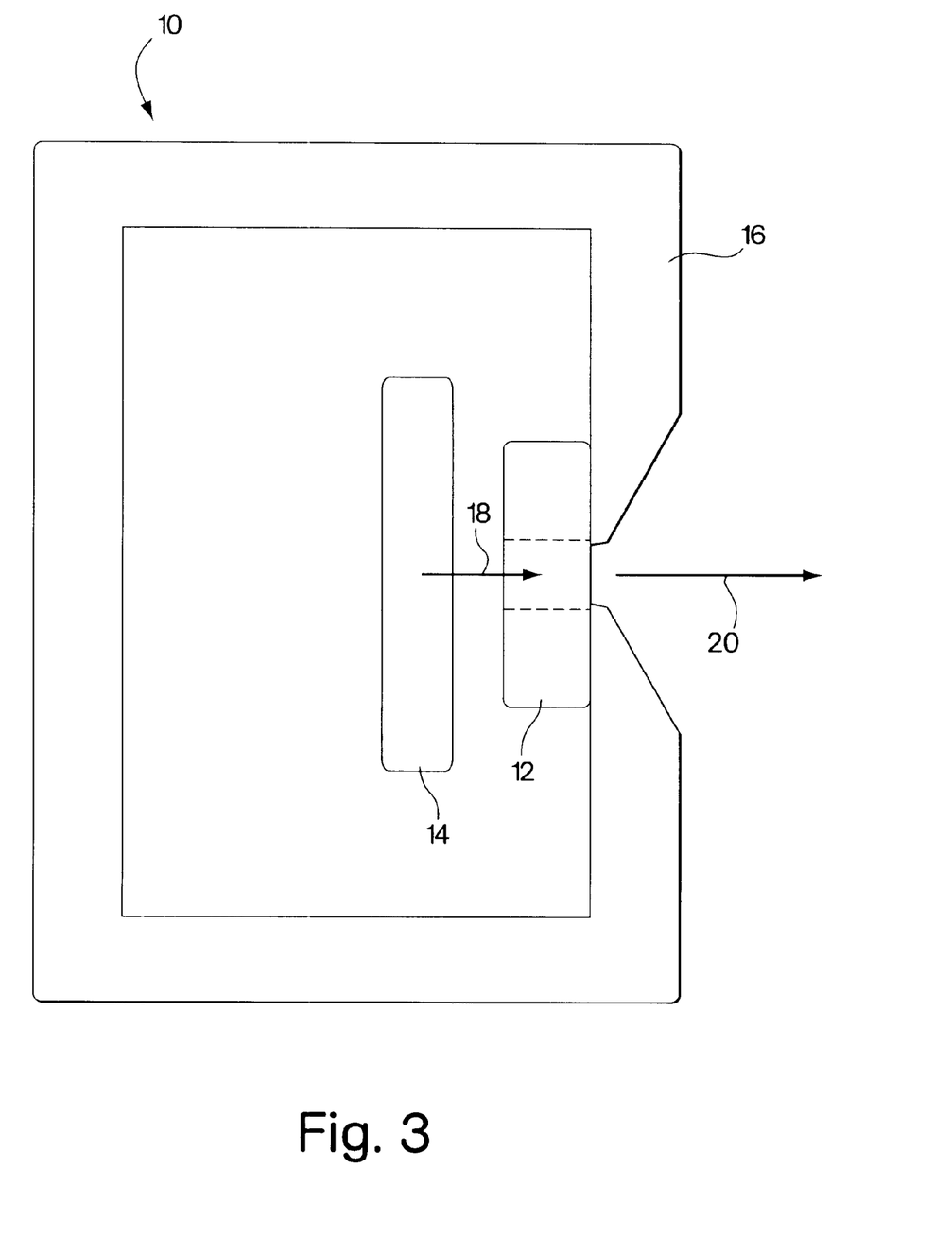
FIG. 3 shows a schematic representation of a side view of an ion source comprising a single cathode.

The cathode target can be used in the ion source of FIG. 2 or in a simplified source shown in FIG. 3. FIG. 3 shows a cross-sectional schematic representation of a side view of a prior art ion source which can be retro-fitted with the cathode target of the invention. In FIG. 3, ion source 10 includes a hollow target cathode 12 and anode 14 positioned within a cylindrical magnetic yoke 16. A source magnetic field having a direction represented by arrow 18 is oriented such that the magnetic field passes through a bore of cathode 12. Ion source 10 is constructed and arranged to produce a resulting ion beam having a direction represented by arrow 20.

Figure 4:
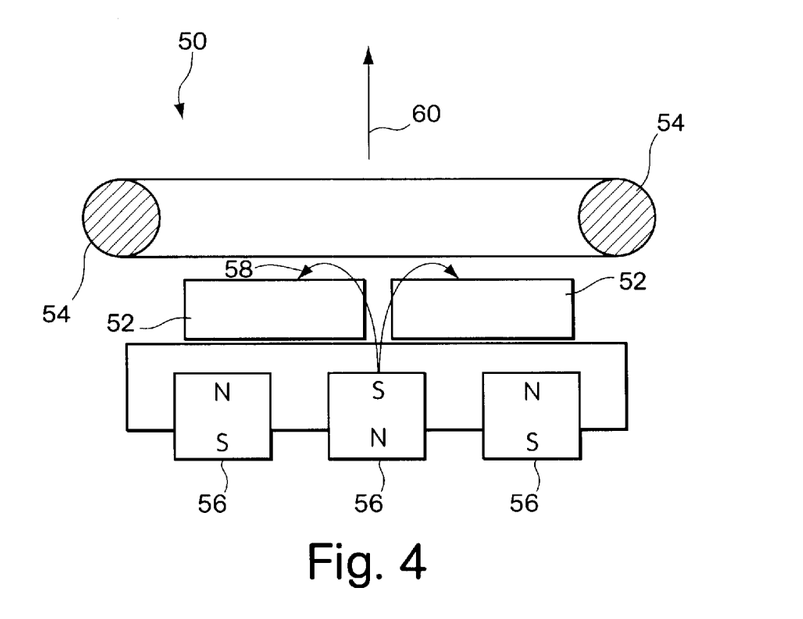
FIG. 4 shows a schematic representation of a side-by-side arrangement of solid cathode discs.

Another aspect of the present invention provides an ion source comprising an array of at least two disc electrodes. In one embodiment, a multiple array of cathode discs, i.e., at least two cathodes, can be arranged in line or side by side and/or in a circular pattern to function as a single cathode with respect to the anode. The discs can be solid or hollow. An example of a multiple array of cathodes is illustrated in FIG. 4, which shows a side view of a substantially linear array of cathodes. Ion source 50 includes solid cathode discs 52 positioned adjacent each other. Cylindrical solid anode 54 (shown in cross section) is positioned above cathode discs 52. Source magnets 56 are positioned below cathode discs 52 to provide a magnetic field having field lines 58. A resulting extracted ion beam has a direction represented by arrow 60. FIG. 4 shows only two cathode discs 52, but it is understood that more than two discs can be incorporated into a multiple arrangement of ion source 50.

Figure 5:
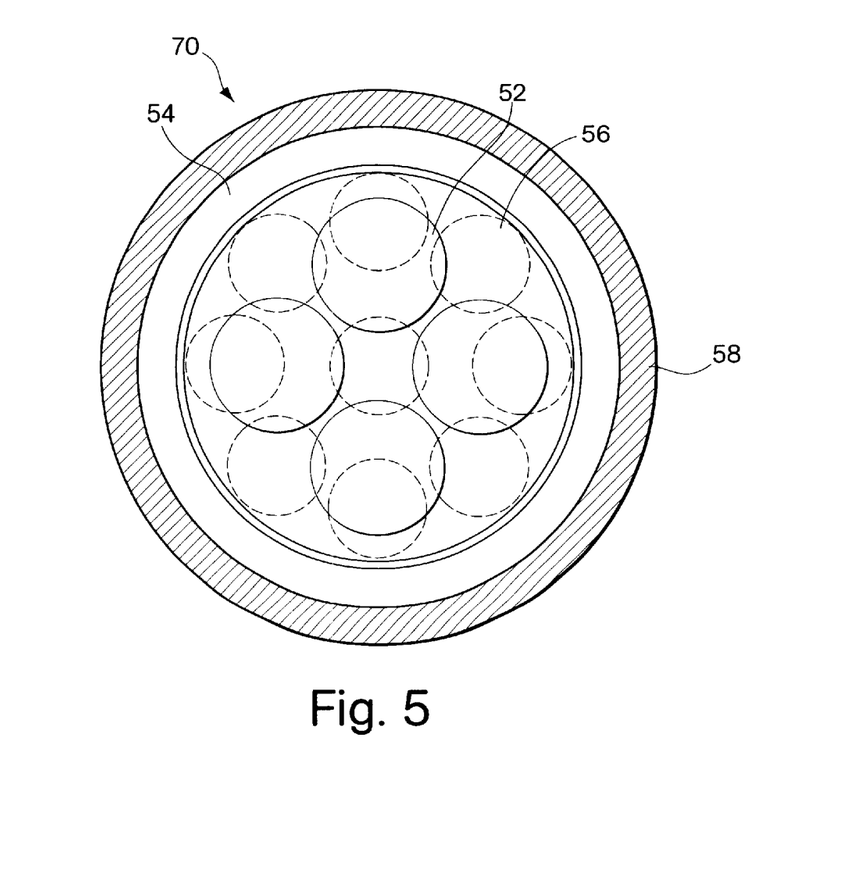
FIG. 5 shows a schematic representation of a top view of a circular arrangement of cathode discs.

In one embodiment, the ion source can have a substantially closed array of disc electrodes. "Substantially closed array" refers to any geometric shape such as a circular array, a square array, rectangular array, triangular array etc., which can surround, optionally, symmetrically, a center point. FIG. 4 also represents a side view of a square 2×2 array of cathode discs 54, also depicted in FIG. 5. FIG. 5 shows a top view of a multiple closed array of ion source 70. A top of ion source 70 contains circular anode 54 positioned above cathode discs 52 (solid circles), which in turn are positioned above source magnets 56 (dashed circles). Again, it is understood that more than four cathode discs 52 can be used in a circular arrangement and one of ordinary skill in the art would know how to vary the size of anode 54 and the size and arrangement of source magnets 56 to accommodate a larger number and/or size of cathode discs 52 and the shape and size of anode 54 in the arrangement of ion source 70. Ion source 70 can be positioned within casing 58.

Another aspect of the present invention provides an ion source comprising a single solid disc electrode. The electrode can be a cathode or an anode. The electrode comprises a boron-containing material having the compositions discussed previously.

Figure 6:
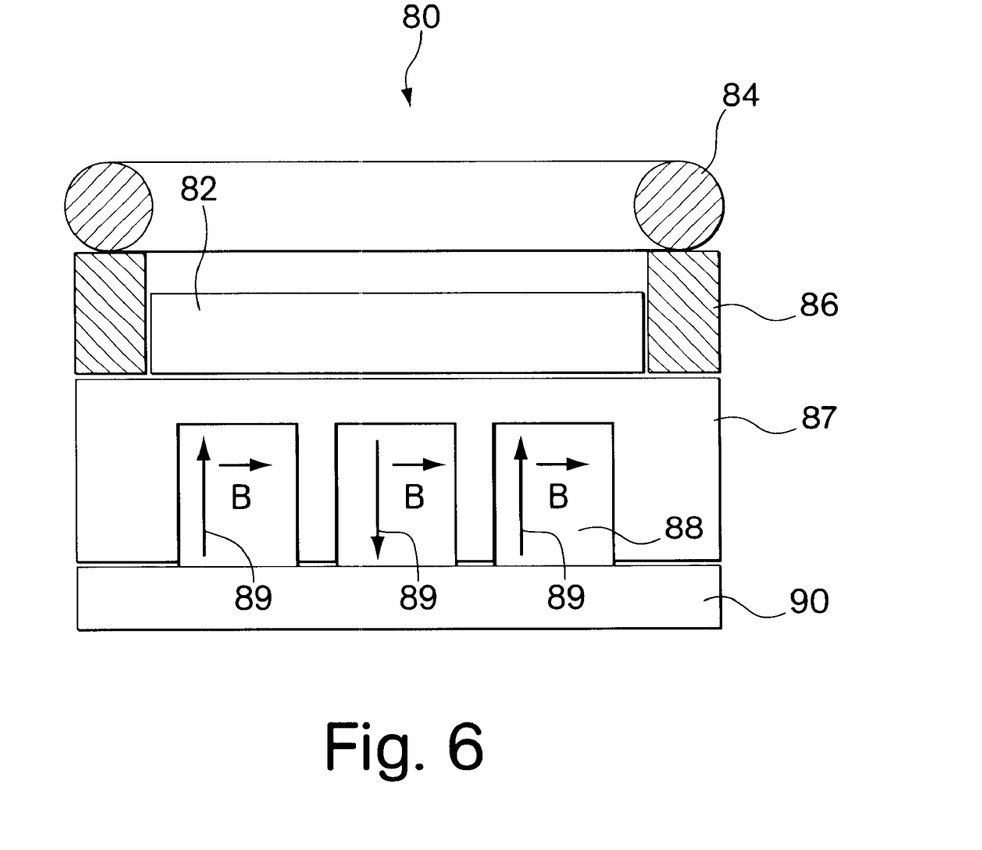
FIG. 6 shows a schematic representation of a side view of an ion source comprising a single cathode disc.

FIG. 6 shows a schematic side view of an ion source 80 comprising a single solid disc cathode 82. Disc cathode 82 is positioned beneath disc anode 84 (shown in cross section) and between two pieces of insulating material 86. Disc cathode 82 is supported by support 87 positioned below cathode 82. Support 87 can also function as retainer for magnets 88. Magnets 88 are positioned within retainer 87 and below cathode 82. Arrows 89 represent a direction of magnetic field lines of magnets 88. Block 90 represents a portion of the magnetron yoke.

The function and advantage of these and other embodiments of the present invention will be more fully understood from the example below. The following example is intended to illustrate the benefits of the present invention, but does not exemplify the full scope of the invention.

As noted above, one aspect of the invention involves novel boron-containing cathode. Other components and arrangements can be selected among those known or readily available to those of ordinary skill in the art

EXAMPLE

This example involves a configuration as described in FIG. 1. Two cylindrical $TiB_2$ cathodes were provided having an outer diameter of 0.400 in. and a thickness of 0.150 in. One cathode had a 0.125 in. inner diameter bore whereas the other cathode had no bore (anticathode). Under an operating vacuum of approximately $2 \times 10^{-5}$, a 6 watts discharge power at 20 mA and 350 V per 100 $\mu$A extracted beam was obtained at 8 kV extraction voltage.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. An ion source, comprising:
   a magnetron disposed in a first housing, the magnetron being constructed and arranged to produce a radial magnetic field coaxial with an axial electrical field, for providing a positively charged, sputtered ion beam from the magnetron; and
   a cold cathode sputtering target disposed in a second housing, the second housing being constructed and arranged to produce a radial electric field and an axial magnetic field for collimating the ion beam from the magnetron, the radial electric field and axial magnetic field being coaxial with each other and with a direction of the sputtered ion beam which is normal to a planar surface of the cold cathode.

2. The ion source of claim 1, wherein the magnetic and electric fields of the magnetron are coaxial with the electric and magnetic fields of the second housing.

3. The ion source of claim 1, further comprising an anticathode in the first housing, the anticathode comprising a target sputtering material and having a planar surface positioned adjacent the magnetron.

4. The ion source of claim 3, further comprising a source of a gas directed into the ion source, for producing a gas discharge.

5. The ion source of claim 4, wherein the gas is selected from the group consisting of neon, helium, argon, nitrogen, carbon dioxide, carbon monoxide and a fluoride-containing gas.

6. The ion source of claim 4, wherein the gas discharge comprises positive ions of the gas.

7. The ion source of claim 4, wherein the gas discharge comprises positive ions of the cathode and anticathode material.

8. The ion source of claim 4, further comprising an annular anode surrounding the axial magnetic field of the second housing, a base of the anode being positioned adjacent to and free of contact with the cathode, the anode being biased positive with respect to the cathode and capable of generating the radial electric field in conjunction with the cathode for trapping electrons which collimate the ion beam from the magnetron.

9. The ion source of claim 8, wherein the cathode has a negative potential.

10. The ion source of claim 9, wherein the anticathode has a variable bias potential.

11. The ion source of claim 10, wherein the anticathode has a negative potential.

12. The ion source of claim 8, further comprising a duct positioned intermediate the first and second housings, the duct being tapered in a direction from the magnetron to the cathode, for channeling the ion beam from the magnetron and for blocking sputter debris from entering the second housing.

13. The ion source of claim 12, wherein the duct is operable at ambient temperature.

14. The ion source of claim 12, further comprising a cooling mechanism surrounding the duct, for condensing volatile material.

15. The ion source of claim 12, wherein the duct taper terminates in the second housing at an aperture in a plate, the plate being adjacent to but free of contact with a base of the anode.

16. The ion source of claim 15, wherein the plate is conductive.

17. The ion source of claim 16, wherein the plate comprises a material selected from the group consisting of graphite and a metal.

18. The ion source of claim 15, wherein the metal plate has a negative bias potential.

19. The ion source of claim 12, further comprising a filament positioned in the duct and arranged to surround the ion beam from the magnetron, the filament being capable of adding electrons to the trapped electrons.

20. The ion source of claim 8, wherein the cathode is free from exposure to a cooling system.

21. The ion source of claim 8, wherein the anticathode is free from exposure to a cooling system.

22. The ion source of claim 3, wherein the cathode and anticathode are operable at a temperature of less than 950° C.

23. The ion source of claim 3, wherein the cathode and anticathode are operable at a temperature of less than 500° C.

24. The ion source of claim 3, wherein the cathode and anticathode are operable at a temperature of less than 200° C.

25. The ion source of claim 3, wherein the cathode and anticathode each comprises a conducting material having a resistivity of less than about 1000 $\mu$ohm·cm.

26. The ion source of claim 25, wherein the conducting material is selected from the group consisting of a carbon material, a metal and a metal compound.

27. The ion source of claim 26, wherein the metal is selected from the group consisting of aluminum, indium, antimony, copper, gold and uranium.

28. The ion source of claim 26, wherein the metal comprises a metal alloy.

29. The ion source of claim 28, wherein the metal alloy comprises a cobalt alloy.

30. The ion source of claim 26, wherein the metal compound is selected from the group consisting of a metal boride, a metal nitride and a metal phosphide.

31. The ion source of claim 30, wherein the metal phosphide is indium phosphide.

32. The ion source of claim 3, wherein the cathode comprises a disc.

33. The ion source of claim 3, wherein at least one of the cold cathode sputtering target and the anticathode comprises:

a boron-containing, sputtering target material selected from the group consisting of a boron alloy, a boride, and mixtures thereof.

34. The ion source of claim 33, wherein the boron-containing material is a boride.

35. The ion source of claim 34, wherein the boride has an $A/B_2$ structure.

36. The ion source of claim 35, wherein the boride is selected from the group consisting of $AgB_2$, $AlB_2$, $AuB_2$, $FeB_2$, $LuB_2$, $NbB_2$, $PuB_2$, $SmB_2$, $TbB_2$, $TmB_2$, $WB_2$, $ZrB_2$, $DyB_2$, $MgB_2$, $GdB_2$, $MoB_2$, $ScB_2$, $TaB_2$, $TiB_2$, $UB_2$, $YB_2$, $CrB_2$, $ErB_2$, $HfB_2$, $HoB_2$, $MnB_2$, $NpB_2$, $VB_2$.

37. The ion source of claim 36, wherein the boride is selected from the group consisting of $FeB_2$, $ZrB_2$, $DyB_2$, $GdB_2$, $MoB_2$, $TaB_2$, $TiB_2$, $YB_2$, $CrB_2$, $ErB_2$, $HfB_2$, $HoB_2$, $MnB_2$, $VB_2$.

38. The ion source of claim 33, wherein the boron-containing material has a resistivity of less than about 1000 $\mu$ohm·cm.

39. The ion source of claim 38, wherein the boron-containing material has a resistivity of less than about 100 $\mu$ohm·cm.

40. The ion source of claim 38, wherein the boron-containing material has a resistivity of less than about 50 $\mu$ohm·cm.

41. The ion source of claim 38, wherein the boron-containing material has a resistivity of less than about 10 $\mu$ohm·cm.

42. A ion source as in claim 38, wherein the boron-containing material is a boride.

43. The ion source of claim 42, wherein the boride is $TiB_2$.

44. The ion source of claim 33, wherein the boron-containing material is a boron alloy.

45. The ion source of claim 33, wherein the boron-containing material is a mixture of a boron alloy and a boride.

46. The ion source of claim 33, wherein the target comprises a magnetic material.

47. The ion source of claim 46, wherein the magnetic material comprises a metal.

48. The ion source of claim 47, wherein the metal is selected from the group consisting of iron and nickel.

49. The ion source of claim 48, wherein the metal is iron.

50. The ion source of claim 46, wherein the magnetic material is a magnetic boride.

51. The ion source of claim 33, wherein the target is constructed and arranged such that the ion source is operable continuously for a time of at least about 50 h.

52. The ion source of claim 33, wherein the target is constructed and arranged such that the ion source is operable continuously for a time of at least about 100 h.

53. The ion source of claim 33, wherein the target is constructed and arranged such that the ion source is operable continuously for a time of at least about 200 h.

54. The ion source of claim 33, wherein the target is constructed and arranged such that the ion source is operable while free of causing significant corrosion.

55. The ion source of claim 33, wherein the target is constructed and arranged such that the ion source is operable while free of significant toxicity.

56. The ion source of claim 3, wherein the anticathode comprises a disc.

57. The ion source of claim 1, wherein the first housing further comprises a first vacuum chamber.

58. The ion source of claim 57, wherein the second housing further comprises a second vacuum chamber.

59. The ion source of claim 58, wherein the vacuum of the second housing is greater than the first housing.

60. The ion source of claim 58, wherein at a vacuum greater than $10^{-4}$ mm Hg, the beam comprising positive ions has an emittance angle of less than 150 milliradians.

61. The ion source of claim 58, wherein at a vacuum greater than $1 \times 10^{-3}$ mm Hg, the beam comprising positive ions has an emittance angle of less than 150 milliradians.

62. The ion source of claim 1, wherein the cathode has a bore, for allowing the ion beam to eject from the ion source via the bore.

63. The ion source of claim 62, wherein the ejected ion beam further comprises positive ions sputtered from the cathode.

64. The ion source of claim 62, wherein the bore is round and the ejected ion beam has cylindrical geometry.

65. The ion source of claim 62, wherein the bore is a slit and the ejected ion beam has planar symmetry.

66. The ion source of claim 1, further comprising a mass spectrometer associated with the magnetron for mass-separating the sputtered ion beam.

67. The ion source of claim 1, wherein the sputtering target comprises a structure with a bore through on axis.

68. An ion source, comprising:

a magnetron having an axis, constructed and arranged to produce a magnetic field radial with respect to the magnetron axis, coaxial with an axial electrical field with respect to the magnetron axis, for providing a positively charged, sputtered ion beam from the magnetron; and a Penning cell including a cold cathode sputtering target and having an axis, the Penning cell being constructed and arranged to produce an electric field radial with respect to the Penning cell axis and a magnetic field axial with respect to the Penning cell axis and being positioned to collimate the ion beam from the magnetron, the Penning cell radial electric field and axial magnetic field being coaxial with each other and with a direction of the sputtered ion beam which is normal to a planar surface of the cold cathode.

69. An ion source comprising:

at least two magnetrons constructed and arranged to produce axial electrical fields coaxial with radial magnetic fields;

first and second housings; and a cold cathode sputtering target, wherein the at least two magnetrons are disposed in the first housing and the cold cathode sputtering target is disposed in the second housing.

70. The ion source of claim 69, wherein the second housing is constructed and arranged to produce a radial electric field and an axial magnetic field for collimating the ion beam from the magnetron, and the radial electric field and axial magnetic field are coaxial with each other with a direction of the sputtered ion beam being normal to a planar surface of the cold cathode.

* * * * *

UNITED STATES PATENT AND TRADEMARK OFFICE
CERTIFICATE OF CORRECTION

PATENT NO.    : 6,352,626 B1
DATED         : March 5, 2002
INVENTOR(S)   : von Zweck It is certified that error appears in the above-identified patent and that said Letters Patent is hereby corrected as shown below:

<u>Column 2,</u>
Line 23, please replace "A/B$_2$" with -- AlB$_2$ --.

Signed and Sealed this

Twenty-first Day of May, 2002

*Attest:*

JAMES E. ROGAN
*Attesting Officer*  *Director of the United States Patent and Trademark Office*

UNITED STATES PATENT AND TRADEMARK OFFICE
CERTIFICATE OF CORRECTION

PATENT NO. : 6,352,626 B1
DATED : March 5, 2002
INVENTOR(S) : von Zweck

It is certified that error appears in the above-identified patent and that said Letters Patent is hereby corrected as shown below:

<u>Column 14,</u>
Line 23, please replace "$A/B_2$" with -- $AlB_2$ --.

Signed and Sealed this

Twentieth Day of August, 2002

Attest:

Attesting Officer

JAMES E. ROGAN
*Director of the United States Patent and Trademark Office*